United States Patent [19]

Yawata et al.

[11] Patent Number: 5,197,384
[45] Date of Patent: Mar. 30, 1993

[54] SCREEN PRINTER

[75] Inventors: Satoshi Yawata, Tsuchiura; Haruo Mishina, Ushiku, both of Japan

[73] Assignee: Hitachi Techno Engineering Co., Ltd., Tokyo, Japan

[21] Appl. No.: 705,532

[22] Filed: May 24, 1991

[30] Foreign Application Priority Data

May 25, 1990 [JP] Japan ................... 2-133830

[51] Int. Cl.[5] .......................................... B41L 13/18
[52] U.S. Cl. ..................... 101/123; 101/423; 101/114
[58] Field of Search ............... 101/423, 425, 480, 122, 101/114, 123, 121, 124, 129; 427/123, 190, 191, 126.1

[56] References Cited

U.S. PATENT DOCUMENTS

| | | | |
|---|---|---|---|
| 3,835,779 | 9/1974 | Ross | 101/425 |
| 4,072,103 | 2/1978 | Fletcher | 101/151 |
| 4,162,652 | 7/1979 | Rebel | 101/425 |
| 4,173,928 | 11/1979 | Mitter | 101/126 |
| 4,307,662 | 12/1981 | Mitter | 101/123 |
| 4,389,936 | 6/1983 | Jaffa | 101/123 |
| 4,826,539 | 5/1989 | Harpold | 134/10 |
| 4,911,074 | 3/1990 | Simila | 101/425 |
| 5,070,782 | 12/1991 | Sakai | 101/123 |

FOREIGN PATENT DOCUMENTS

| | | | |
|---|---|---|---|
| 243851 | 2/1912 | Fed. Rep. of Germany | 101/425 |
| 209158 | 9/1986 | Japan . | |
| 4948 | 1/1988 | Japan | 101/425 |

OTHER PUBLICATIONS

Japanese Utility model Unexamined Publication No. 62-178145 (Usami et al.), Dec. 11, 1987.
"Ion-O-Vac Sheet & Webcleaner" Product Brochure, Herbert Products Inc., Westbury N.Y., 1972.

Primary Examiner—Edgar S. Burr
Assistant Examiner—Eric P. Raciti
Attorney, Agent, or Firm—Antonelli, Terry, Stout & Kraus

[57] ABSTRACT

A screen printer which has a cleaning device for cleaning a mask which is formed with at least a hole of a printing pattern. The cleaning device includes a spatula member and an airstream generating device. The spatula member is moved along the surface of the mask in contact therewith so as to scrape ink adhered to the mask surface. The airstream generating device generates an airstream passing through the hole of the mask so as to remove ink within the hole of the mask.

19 Claims, 11 Drawing Sheets

SCREEN PRINTER

BACKGROUND OF THE INVENTION

The present invention relates to a screen printer, and more particularly, to a screen printer equipped with a mask cleaning device which serves to remove ink dregs adhered to one surface of a mask and holes formed in the mask. Although not limitative, the screen printer of this kind is suitable to form a film on an electronic circuit board or substrate.

Repetition of the film formation on the substrate due to the screen printing process causes ink to remain on a mask surface adjacent to the substrate and in holes of the mask. If the printing is further continued, the remaining ink will bring about defective printing such as blot, blur, discontinuity of line or the like of an ink pattern printed on the substrate. For this reason, it is necessary to wipe the adhered ink dregs by cleaning the mask each time the printing has been repeated a predetermined number of times.

On the other hand, with the development of electronics, a mask is required to obtain high definition. That is, the area of hole pattern on the mask and the space between adjacent holes tend to be reduced. As a result, the ink remains in the holes of the mask as well as adhere to the lower surface of the mask. To cope with this, it is necessary to increase the frequency of mask cleaning.

Heretofore, cleaning of the mask has been performed by hand. However, the operation by hand alone cannot cope with the increase of the frequency of mask cleaning so that not only the printing efficiency is deteriorated but also defective printing is increased.

Recently, devices for automatically performing the cleaning have been proposed. These automatic cleaning devices are disclosed in Japanese Patent Unexamined Publication Nos. 62-152853, 63-173643 and 63-296942 as well as in Japanese Utility Model Unexamined Publication Nos. 60-85931 and 62-178145, for example.

However, the proposed devices including the cleaning by hand are not satisfactory in terms of the cleaning efficiency and the ability to remove the ink dregs.

SUMMARY OF THE INVENTION

An object of the present invention is to provide a screen printer equipped with an improved mask cleaning device.

Another object of the invention is to provide a screen printer equipped with a cleaning device which is capable of removing even the ink remaining on one surface and in holes of a mask of high definition.

Still another object of the invention is to provide a screen printer equipped with a cleaning device which is capable of automatically removing the ink remaining in the mask efficiently and surely.

A further object of the invention is to provide a screen printer which is capable of positively removing the ink remaining in the mask so as to be made free from defective printing, thereby improving the printing efficiency.

To accomplish the above objects, in the invention, mechanical scrape and removal of ink by airstream are used in combination suitable to remove extra ink adhered to a mask and ink remaining in holes of the mask.

In accordance with an aspect of the invention, a screen printer comprises, in addition to a apparatus for printing a printing pattern of a mask with ink on a matter to be printed such as an electronic circuit board, for example, spatula means movable in contact with a surface of the mask for removing the ink adhered to the mask surface, and means movable with the spatula means for generating an airstream passing through holes of the mask to remove the ink in the holes.

Although to be described later in detail, adhesion of ink to the surface of the mask and ink remaining in the holes of the mask are brought about when the mask is separated from the printed matter after the printing. With the apparatus of the invention, the spatula means is moved in contact with the mask so as to remove the ink adhered to the surface of the mask. Further, the airstream passing through the holes of the mask causes the ink adhered to the side walls of the holes to come off so as to directly remove the ink or causes the ink remaining in the holes to come out of the holes so as to make it possible to scrape the ink away by the spatula means. In this way, the ink adhered to the surface of the mask and the ink remaining in the holes of the mask can be removed efficiently and surely, with the result that even a high definition mask can be cleaned perfectly.

Accordingly, it is possible to be freed from defective printing and, therefore, it is even possible to continue unattended screen printing over a long period of time.

The airstream generating means may be designed to draw air through the holes. In this case, the ink removed from the mask is sucked into the airstream generating means without becoming dust floating in the air, so that this kind of airstream generating means is suitable for application in a clean room.

It is preferred that the airstream generating means includes a port for air or an air hole located forward of the spatula means in the direction of movement of the latter. By disposing such air holes forward and rearward of the spatula means respectively, the effect of removing the ink by the airstream can be enhanced.

It is preferable that the spatula means is formed in a shape wherein its leading edge makes a rake angle with respect to the mask. In this case, as the spatula means is moved along the mask, the ink is scooped out with the leading edge so as to be scraped from the mask surface. Accordingly, there is no possiblity that the ink scraped on the spatula means is pressed or plastered into the holes of the mask.

In case that the ink is high viscosity one or dried, it may be difficult to remove the residual ink even with the above means. In such case, it is preferred to provide means for applying solvent to the ink on the mask. This means may be a member which can be saturated with the solvent for ink, and may be movable together with the spatula means. At the time of cleaning the mask, the dried ink is softened by the solvent so that it becomes easy to remove the residual ink by the spatula means and the airstream generating means. Further, it is preferable to provide means for removing extra solvent so as to prevent the printing ink from being dissolved due to the residual solvent. The extra solvent removing means may include a member which is capable of absorbing the solvent. It is preferred that this member is formed as a roller for the purpose of increasing the contact area with the mask so as to make it easy and sure to collect the solvent.

It is preferred to dispose the means for applying the solvent forward of the spatula means in the direction of movement of the latter. It is also possible to dispose it rearward of the spatula means. In the later case, the ink in the holes of the mask is softened by the solvent so that the ink can be squeezed out of the holes smoothly at the time of printing effected after the cleaning, thereby solving the defective printing. Further, even in a case where the ink enters into a flaw and concave in the mask surface it is difficult to remove the ink with the spatula means, the surface of the mask can be cleaned completely by wiping the residual ink with the solvent applying means and the solvent removing means.

Furthermore, in accordance with another aspect of the invention, a screen printer comprises printing means including a mask formed with at least a hole of a printing pattern for printing the pattern by squeezing ink through the hole of the mask, and mask cleaning means for removing the ink remaining in the mask. The mask cleaning means has a spatula member movable in contact with one surface of the mask for scraping the ink adhered to the one surface and an air stream generating device disposed on one side of the mask for removing the ink within the hole of the mask by an airstream. The air stream generating device is provided with at least an air hole movable with the spatula member so as to be opened at a fixed distance from the mask as well as located forward of the spatula member in the direction of movement of the latter.

BRIEF DESCRIPTION OF THE DRAWINGS

The foregoing and other objects, feature as well as advantages of the invention will be made clear by the description which will be made with reference to accompanying drawings hereinafter, in which.

DESCRIPTION OF PREFERRED EMBODIMENTS

At the outset, description will be given of the structures of the above-described cleaning devices of the prior arts for clear understanding of improvement made by the present invention.

Figure 25:
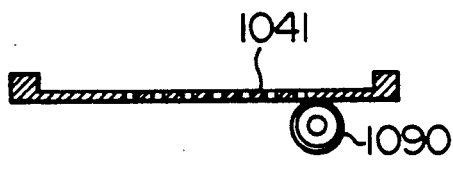
FIGS. 25 to 29 are schematic views showing cleaning devices of the prior art, respectively.

FIG. 25 shows a device which has been proposed in Japanese Patent Unexamined Publication No. 63-173643. This device has a cylindrical cleaning roller 1090 which is to be moved along the lower surface of a mask 1041 for serving to remove ink from the lower surface of the mask.

Figure 26:
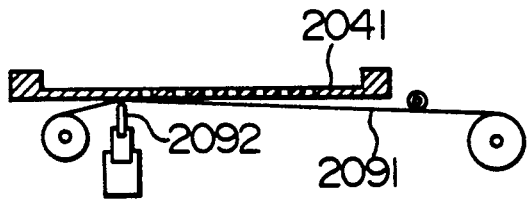

A device proposed in Japanese Patent Unexamined Publication No. 62-152853 is shown in FIG. 26. The device is equipped with means for wiping the lower surface of a mask 2041. This means has a wiping roll paper 2091 extended along the mask and a wiping squeegee 2092 which is to be moved while pressing the roll paper against the lower surface of the mask.

Figure 27:
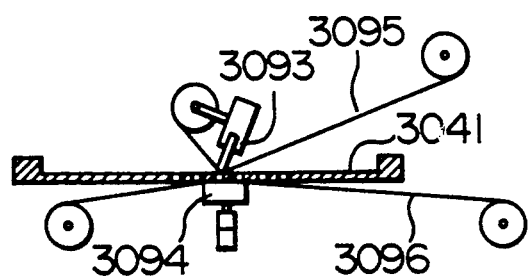

On the other hand, Japanese Patent Unexamined Publication No. 63-296942 has proposed a device in which wiping sheets 3095 and 3096 are disposed above and below a mask 3041, respectively, as shown in FIG. 27. These sheets are to be moved while being pressed against the mask by a cleaning squeegee 3093 and a push 3094 so as to remove the ink from the mask.

Figure 28:
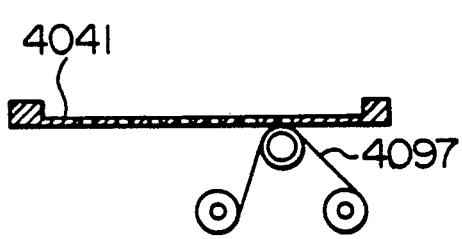

FIG. 28 shows a device proposed in Japanese Utility Model Unexamined Publication No. 60-85931. This device has a roll of cloth 4097 soaked with solvent, which cloth is to be pressed against the lower surface of a mask 4041 so as to wipe the ink.

Figure 29:
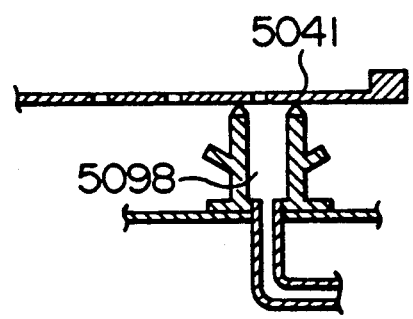

A device proposed in Japanese Utility Model Unexamined Publication No. 62-178145 has a vacuum suction portion 5098. This vacuum suction portion is to be moved along the lower surface of a mask 5041 as shown in FIG. 29 so as to serve to absorb the ink.

Among these prior arts, cleaning by the cleaning roller or wiping sheet is effective to for cleaning a mask wherein the hole size is relatively large. However, in the case of a high definition mask, it is impossible to wipe thoroughly the dregs of ink in the holes. Further, cleaning by vacuum suction to remove the dregs of ink by suction with a suction port in contact with the surface of the mask does not completely remove high viscosity ink or the like.

The above problems have been found and analyzed by the present inventors, and constitute the basis of the present invention.

Description will be given below of preferred embodiments of the invention with reference to the accompanying drawings.

Figure 1:
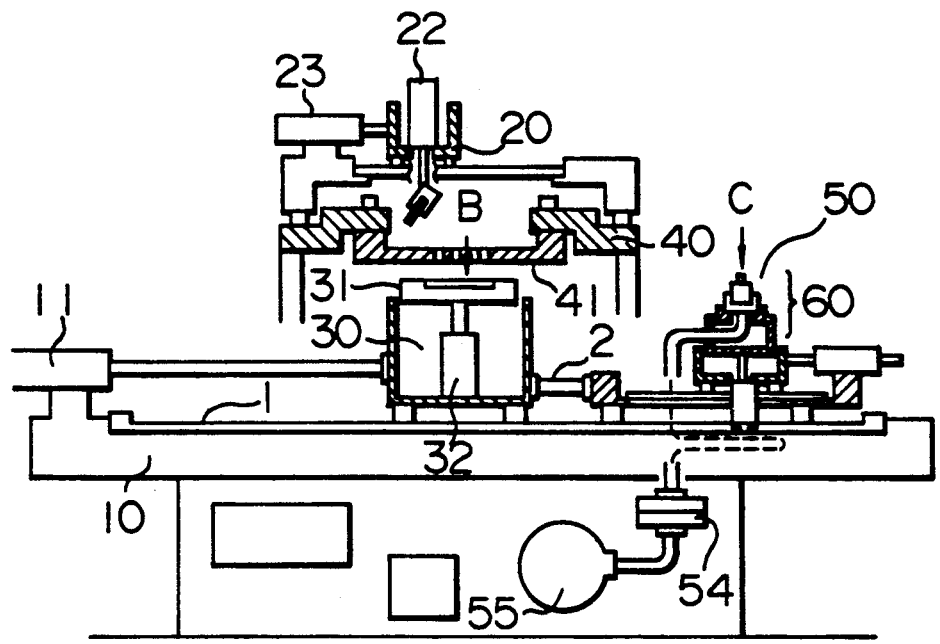
FIG. 1 is a sectional side view of a screen printer according to a first embodiment of the invention.

Referring to FIG. 1, a screen printer according to a first embodiment of the invention comprises a bed unit 10, a squeegee unit 20, a table unit 30, a mask unit 40, and a mask cleaning unit 50. The construction of the screen printer of this invention is the same as that of the prior art except the cleaning unit. Therefore, only portions related to the cleaning unit will be described in this specification.

The table unit 30 is intended to carry the matter to be printed, and the mask unit 40 is intended to be attached with a mask 41 in which at least a through hole (referred to as hole, hereinafter) of a printing pattern is perforated. The bed unit 10 is provided on the upper surface thereof with rails 1 so that the table unit 30 and the mask cleaning unit 50 are movably guided on these rails. The table unit 30 is connected to the mask cleaning unit 50 through a link plate 2 and is moved by the action of a cylinder 11.

Figure 3:
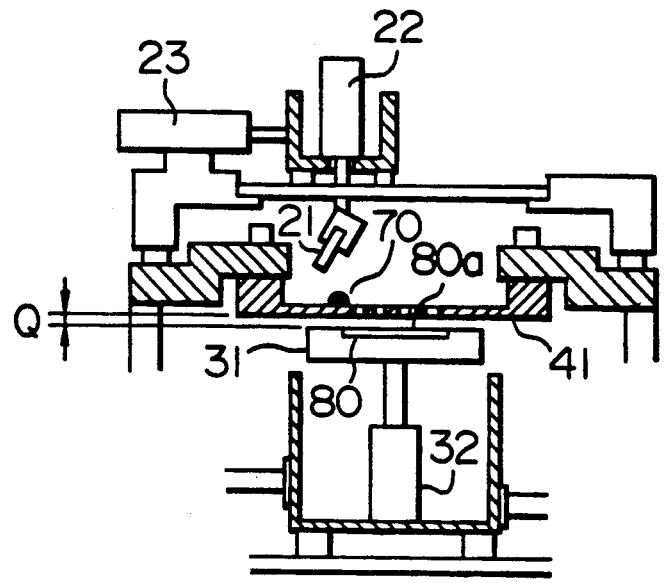
FIG. 3 is a sectional side view of the screen printer of FIG. 1 before start of printing, showing the relationship between a squeegee and a mask.
Figure 4:
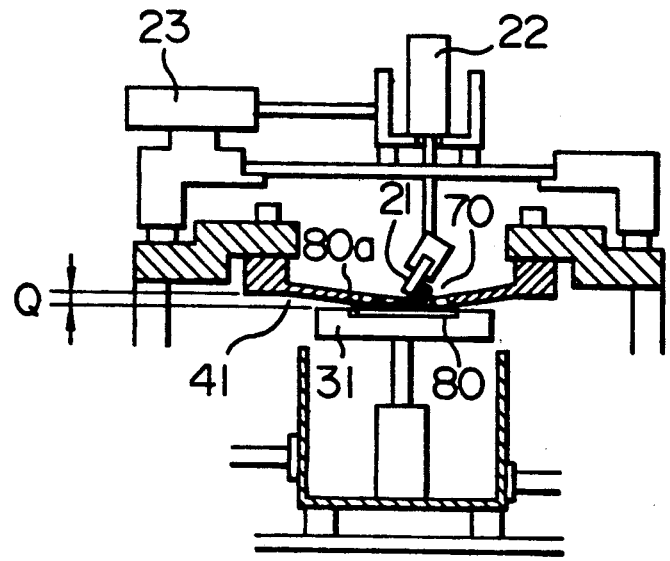
FIG. 4 is a sectional side view of the screen printer of FIG. 1 in the cleaning mode, showing the relationship between the squeegee and the mask.

In printing, the table unit 30 carrying the matter to be printed is moved to a position B below the mask 41 as shown in FIG. 1. With the movement of the table unit 30, the mask cleaning unit 50 is caused to move to a position C. Subsequently, a table 31 of the table unit 30 is raised by the action of a cylinder 32 to a position located at distance Q from the lower surface of the mask 41 as shown in FIG. 3. Thereafter, a squeegee 21 of the squeegee unit 20 disposed above the mask 41 is moved downward by the action of a cylinder 22 so as to come in contact with the mask 41 as shown in FIG. 4. The mask 41 is pressed slightly downwards to come in contact with the matter to be printed such as, for example, an upper surface 80a of a printed circuit board (referred to as substrate, hereinafter) 80 disposed on the table 31. In this state, the squeegee 21 is moved by the action of a cylinder 23 horizontally to the right as viewed in the drawing, as shown in FIG. 4. Ink on the mask is squeezed out through the holes of the mask 41 by the squeegee 21 so that a pattern of the mask 41 is printed on the substrate 80.

Figure 2:
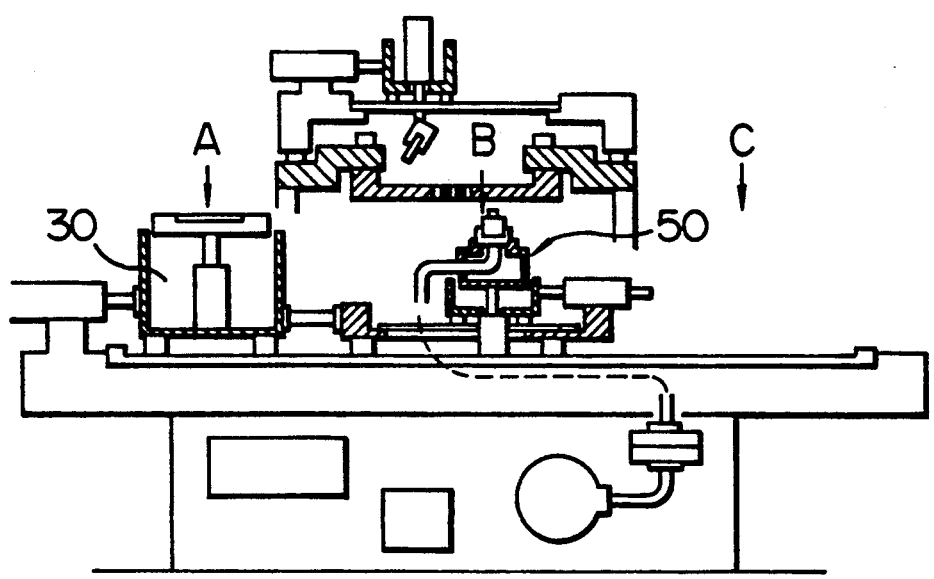
FIG. 2 is a sectional side view of the screen printer of FIG. 1 in the cleaning mode, in which a table unit and a cleaning unit are positioned differently from FIG. 1.

In changing the substrate 80 or in cleaning the mask, the table unit 30 is moved to a position A and the mask cleaning unit 50 to the position B, as shown in FIG. 2. Although it is designed in this embodiment that the table unit 30 and the cleaning unit 50 are driven by the same cylinder, they may be driven by separate driving sources individually.

Figure 5:
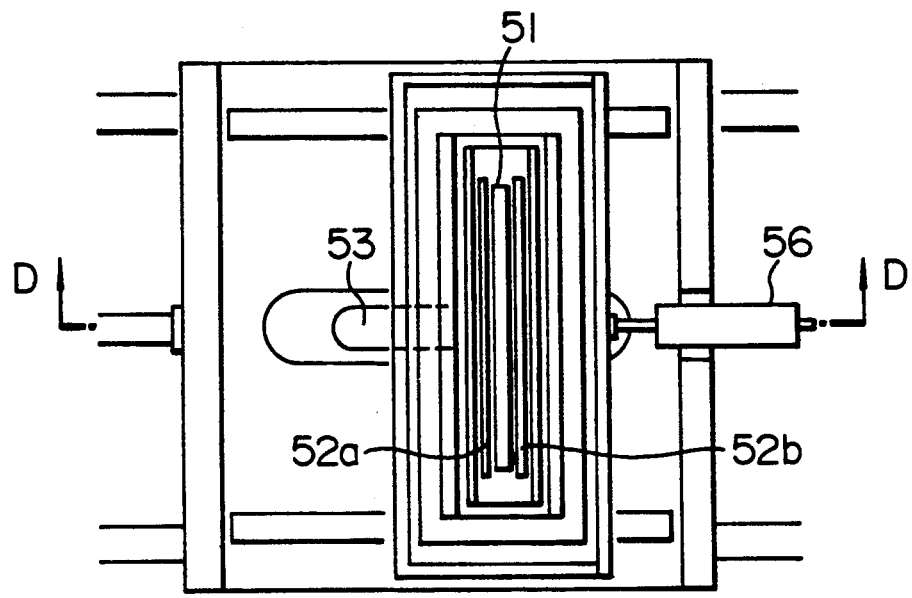
FIG. 5 is a plan view showing, on an enlarged scale, the cleaning unit of the screen printer of FIG. 1.
Figure 6:
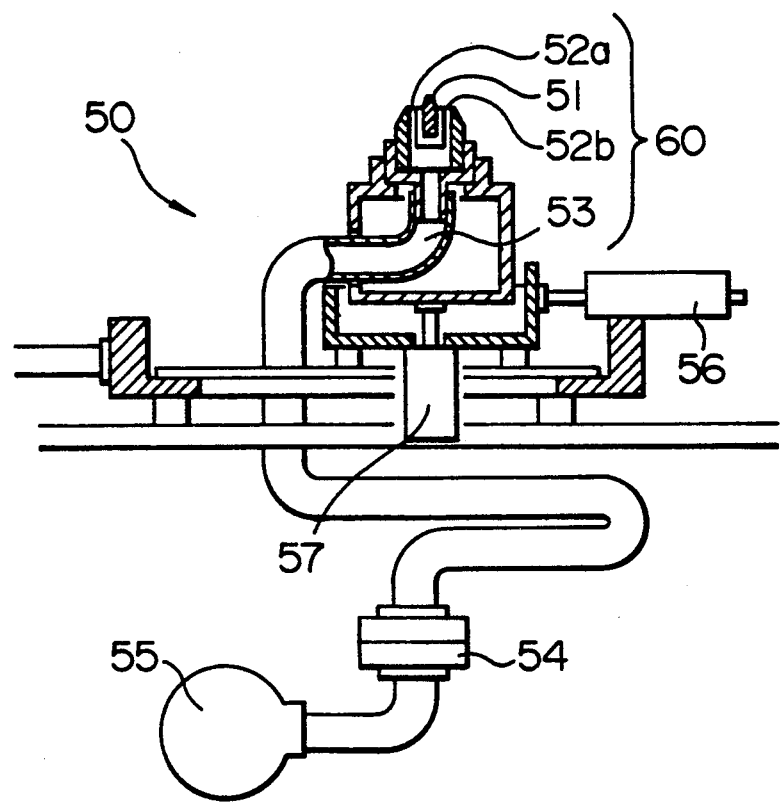
FIG. 6 is a sectional side view taken along the line D—D of FIG. 5.

Referring to FIGS. 5 and 6, the cleaning unit 50 has a cleaning head 60 in which a spatula member 51 and suction ports 52a, 52b are provided. The cleaning head 60 is attached to the base portion of the cleaning unit 50 so as to be movable to the right and left as viewed in the drawing. The spatula member 51 which is made of a flexible material and shaped as an elongated member of rectangular cross section is held by the cleaning head 60 such as to extend across the mask 41. The suction ports 52a, 52b are disposed at the fore and rear of the cleaning head 60 with the spatula member 51 interposed therebetween. These suction ports are connected with suction means 55 through a suction hose 53 and an ink filter 54. The cleaning unit 50 further includes a cylinder 56 which is connected to the cleaning head 60 for moving the same horizontally.

Figure 7:
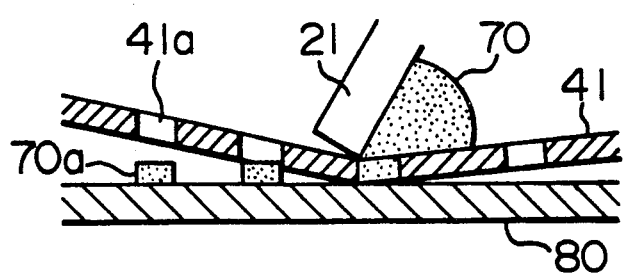
FIGS. 7 and 8 are sectional views for explanation of the relationship between the mask and ink in the state of normal printing.
Figure 8:
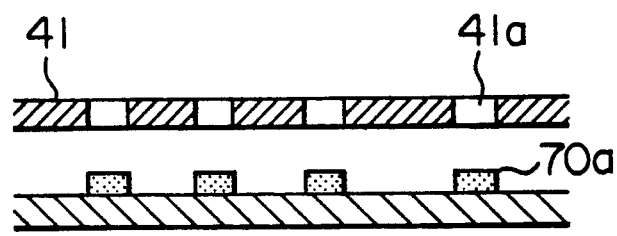
Figure 9:
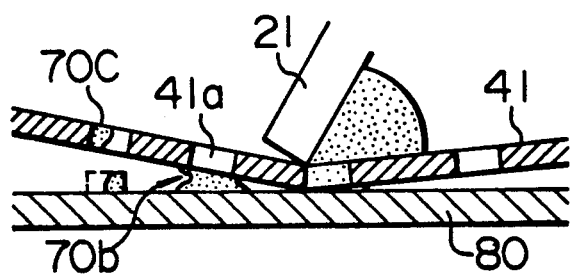
FIGS. 9 and 10 are sectional views for explanation of the relationship between the mask and ink in the state of defective printing.
Figure 10:
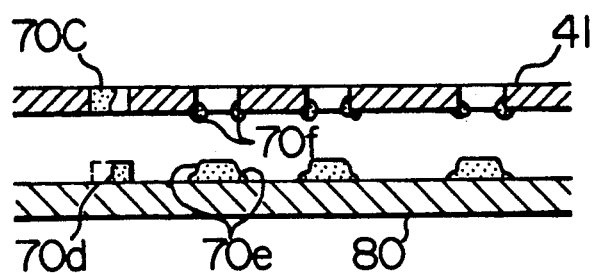

Normal printing is performed in the state shown in FIG. 7. Namely, ink 70 can be printed clearly on the substrate 80 as shown in FIG. 8 without blotting the substrate nor remaining or clogging in the holes 41a of the mask 41. In this state, it is not necessary to make the mask cleaning unit 50 operate. On the other hand, in case that the ink blots the substrate as indicated by 70b or remains or clogs in the holes 41a of the mask 41 as indicated by 70c in FIG. 9, the substrate 80 after being printed is blurred or blotted with ink as indicated by 70d or 70e or the ink remains in the holes 41a of the mask 41 as indicated by 70f in FIG. 10, resulting in defective printing. In such case, the mask cleaning unit 50 is to be used after the completion of a prescribed number of repetitions of printing in accordance with the frequency of occurrence of defective printing.

Figure 11:
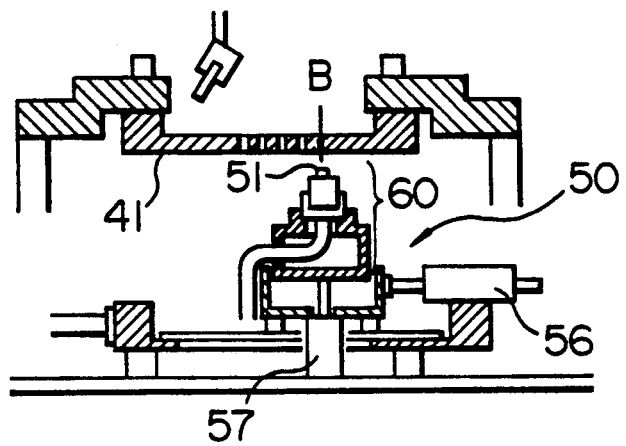
FIGS. 11 to 13 are sectional views for explanation of the operation of the cleaning unit of the screen printer shown in FIG. 1.
Figure 12:
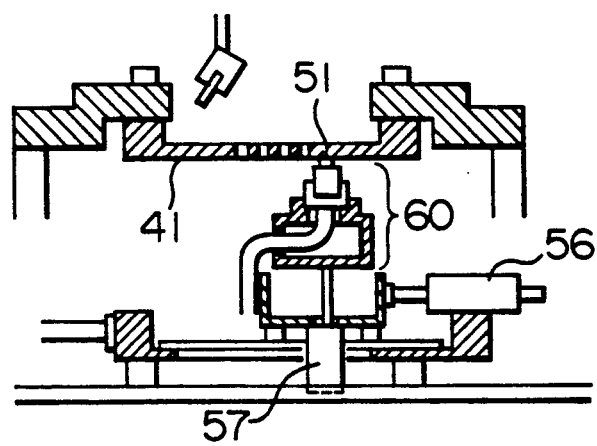
Figure 13:
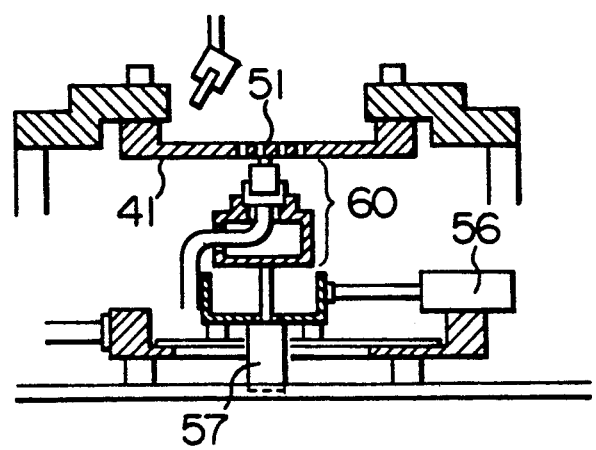

Next, operation of the mask cleaning unit 50 will be described with reference to FIGS. 11 to 13.

As described above, the cleaning unit 50 is present at the position B below the mask 41 in mask cleaning. FIG. 11 shows the mask cleaning unit 50 in this case. Then, the cleaning head 60 is raised by the action of a cylinder 57 to make the spatula member 51 come in contact with the lower surface of the mask 41 as shown in FIG. 12. At this time, the suction ports 52a, 52b are located at a prescribed distance from the lower surface of the mask 41, and the suction means 55 starts to operate. In this state, the spatula member 51 is driven by the cylinder 56 so as to be moved horizontally to the left in the drawing while being kept in contact with the lower surface of the mask 41 as shown in FIG. 13. During this horizontal movement, the ink 70c, 70f adhered to or clogged in the mask 41 can be removed. It is preferable that the prescribed distance for the suction ports is about 1 mm or less.

Figure 14:
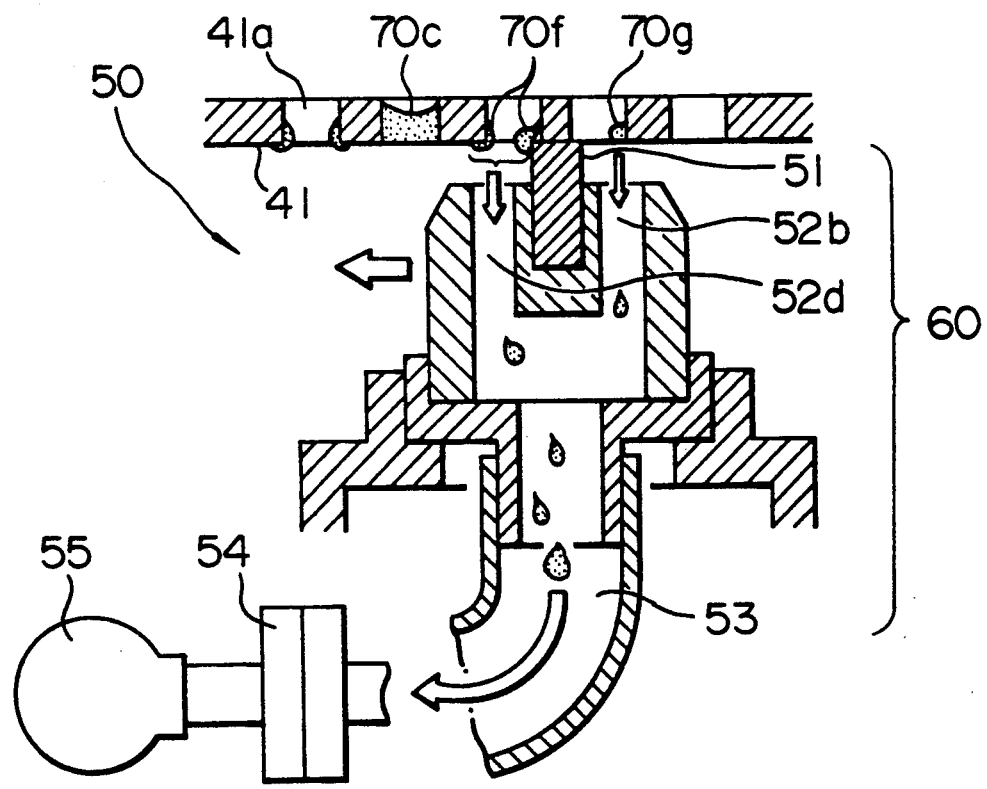
FIG. 14 is a sectional view showing, on an enlarged scale, the state of a cleaning head and the mask of the screen printer of FIG. 1 in the cleaning mode.

FIG. 14 shows the state that the dregs of ink are removed from the mask 41. Ink dregs 70f protruding beyond the lower surface of the mask 41 are wiped off by the front edge of the spatula member 51 and drawn immediately into the suction port 52a. Further, the ink 70c remaining or clogging in the holes 41a of the mask 41 is also drawn into the suction port 52a directly. On the other hand, an ink bit 70g pushed back into the holes 41a by the spatula member 51 is absorbed by the suction port 52b at the rear of the spatula member 51. The ink 70c, 70f, 70g thus drawn is made to pass through the suction hose 53 so as to be caught by the ink filter 54.

In this way, the cleaning head 60 is moved horizontally until it passes over the range where the mask 41 is made to come in contact with the substrate 80 in printing, thereby cleaning the mask 41. Thereafter, the suction means 55 is stopped and, at the same time, the cylinders 56, 57 are operated to return the mask cleaning unit 50 to the state shown in FIG. 11, thus completing the cleaning of the mask 41.

Although the above embodiment is equipped with the cylinder 56 for moving horizontally the cleaning head 60, the construction of the cleaning unit 50 may be simplified. A simplified modification will be described in conjunction with FIGS. 15 to 17. Hereinafter, the same component parts as those of the first embodiment will be designated by the same reference numerals and the detailed description thereof will be omitted.

In this modification, cleaning of the mask 41 is to be performed simultaneously with the movement of the table unit 30 after the completion of the printing, for example. Namely, in a mask cleaning unit 150 of this modification, the cleaning head 60 itself is not permitted to move horizontally with respect to the cleaning unit, and the spatula member 51 for mask cleaning is moved horizontally by the cylinder 11. Further, the connecting distance between the table unit 30 and the cleaning unit 150 is set to be shorter as compared with the case of the first embodiment.

Figure 15:
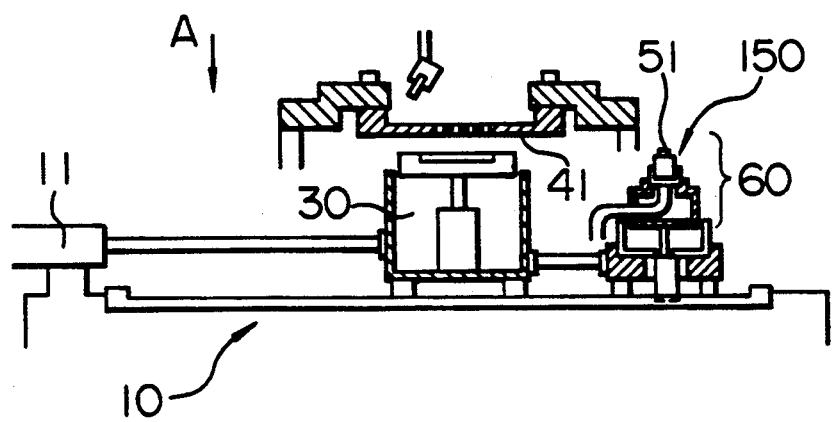
FIGS. 15 to 17 are sectional side views of a modification of the screen printer of FIG. 1.
Figure 16:
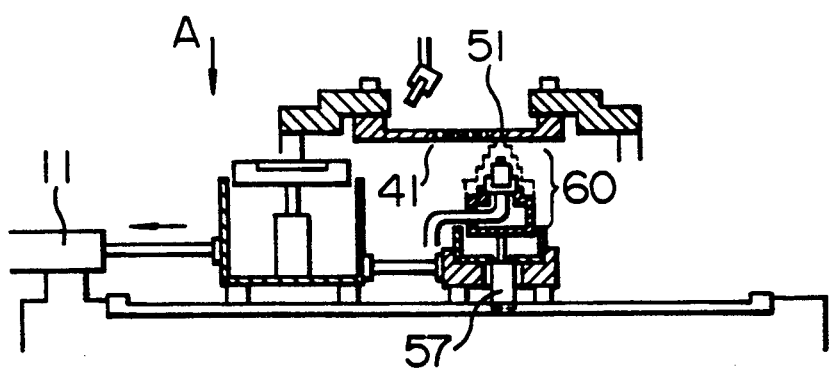
Figure 17:
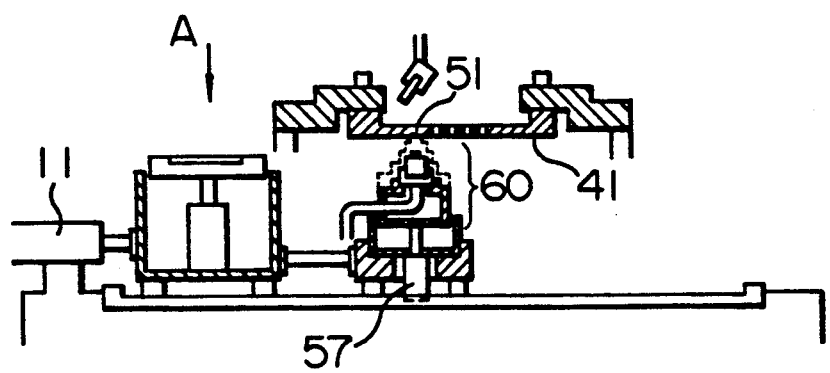

In operation of this modification, when the table unit 30 is moved by the action of the clyinder 11 from the position shown in FIG. 15 to the position A, the cleaning unit 150 connected with the table unit 30 is moved as well. When the cleaning unit 150 arrives at the position shown in FIG. 16, the cylinder 57 is operated to raise the cleaning head 60 as indicated by dotted lines in FIG. 16 so as to make the spatula member 51 come into contact with the mask 41. The cleaning unit 150 is moved horizontally while it is maintained in this state so as to remove the ink from the mask. Then, as shown in FIG. 17, when the spatula member 51 passes over the range where the mask 41 is made to come in contact with the substrate 80 in printing, the cylinder 57 is operated again to lower the cleaning head 60, thereby completing the cleaning of the mask 41. According to this modification, the structure of the cleaning unit is simplified and, in addition, the time required for the cleaning can be shortened.

Figure 18:
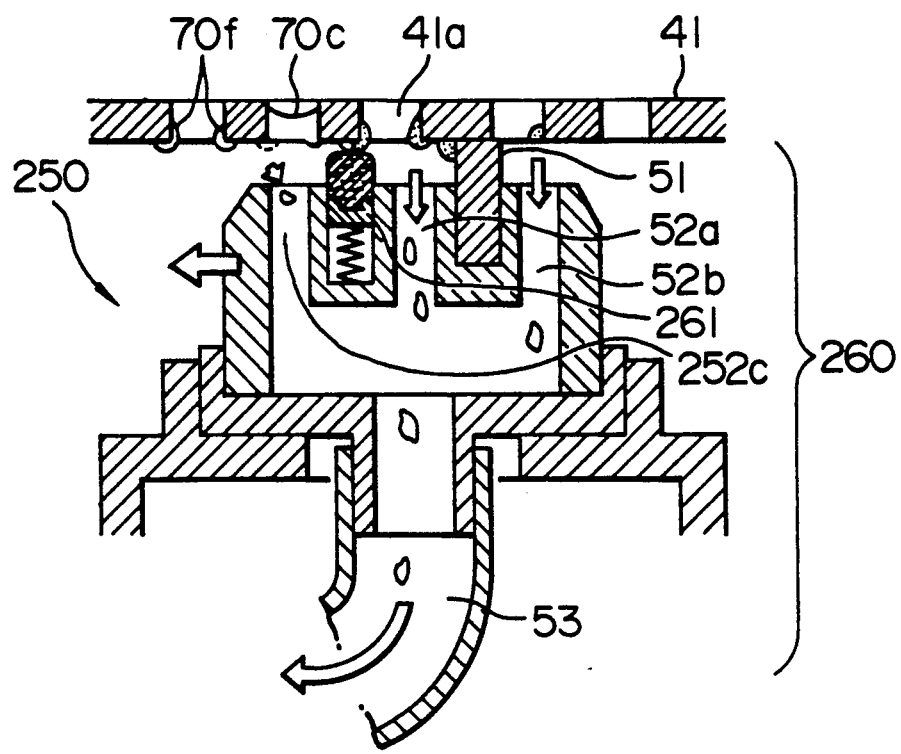
FIGS. 18 and 19 are sectional views showing, on an enlarged scale, cleaning heads of screen printers according to second and third embodiments of the invention, respectively.

Next, a screen printer according to a second embodiment of the invention will be described with reference to FIG. 18. The printer of this embodiment has the same construction as that of the first embodiment except a cleaning head of a cleaning unit 250, and FIG. 18 shows only essential portions of the cleaning head 260. The cleaning head 260 is formed with a wetted member 261 and a suction port 252c in addition to the spatula member 51 and suction ports 52a, 52b. The wetted member 261 is made of a spongy material imbued with solvent and held by the cleaning head 260 through a spring so as to be biased upwardly. The wetted member 261 is disposed in front of the suction port 52 so as to extend substantially in parallel with the spatula member 51. Further in front of the wetted member, the additional suction port 252c is disposed so as to be connected with the suction hose 53. In consequence, the cleaning head 260 has the wetted member 261 and the spatula member 51 located at the front and rear thereof, respectively, with respect to the direction of its movement, as well as the suction ports 252c, 52a and 52b disposed in front of the wetted member, in rear of the spatular member, and between these members, respectively.

In the cleaning operation mode of this embodiment, according as the cleaning head 260 is moved along the lower surface of the mask 41, the wetted member 261 serves first to make the solvent permeate into the ink dregs 70c, 70f which are hard to be removed due to dryness or the like, thus facilitating the removal. Subsequently, the spatula member 51 and the suction ports 52a, 52b serve to remove the ink dregs 70c, 70f in the same manner as the above-described embodiment, thereby cleaning the mask 41. The suction port 252c serves to remove the absorbable ink dregs before penetration of the solvent. The device of the second embodiment is suitable to the case that it is difficult to remove the ink remaining in the holes or on the lower surface of the mask 41 because of high viscosity or dryness of the ink, for example.

Figure 19:
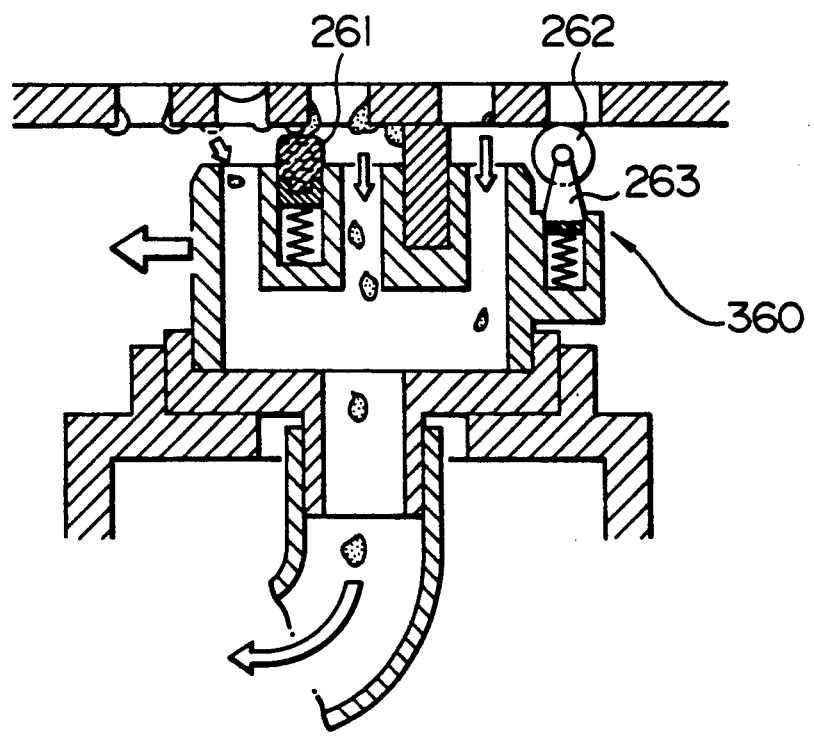

Referring to FIG. 19, a screen printer according to a third embodiment of the invention further comprises a means for removing extra solvent in addition to the construction of the above-described second embodiment. This means is constituted by a roller-shaped blotting paper 262 and a member 263 for rotatably supporting this roller. The roller is intended to be pressed against the lower surface of the mask by means of a spring.

Figure 20:
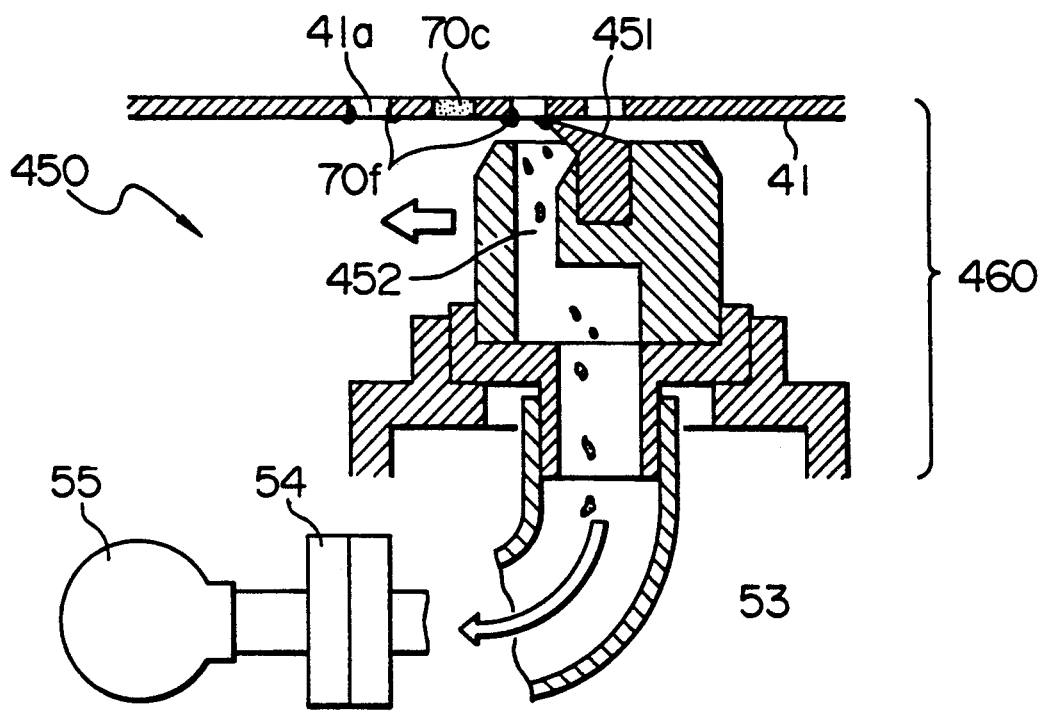
FIG. 20 is an illustration similar to FIG. 14 but showing essential portions of a screen printer according to a fourth embodiment of the invention.

A screen printer according to a fourth embodiment of the invention is equipped with a rake-angled spatula member 451 in a cleaning unit 450 as shown in FIG. 20. A cleaning head 460 is provided with only one suction port 452 which is disposed in front of the spatula member 451. Other construction of this embodiment is substantially the same as that of the first embodiment.

The spatula member 451 is made of a fluoroplastic and shaped to have a beak-like projection in its section. The fluoroplastics exhibits a small abrasion resistance to the mask 41 and gives a low thickness to the ink. Moreover, it has proved as a result of experiment by the present inventors that the fluoroplastic spatula member is hard to get into the holes 41a of the mask 41 during its horizontal movement due to elastic deformation of the beak-like projection or the forward end thereof so as to achieve the best performance in cleaning and removing the ink dregs.

In cleaning, the ink dregs 70f adhered to the lower surface of the mask 41 are scraped by the forward end of the spatula member 451 and immediately drawn into the suction port 452 as shown in FIG. 20. The ink dregs 70c clogging and remaining in the holes 41a of the mask 41 are also drawn into the suction port 452 directly.

Figure 21:
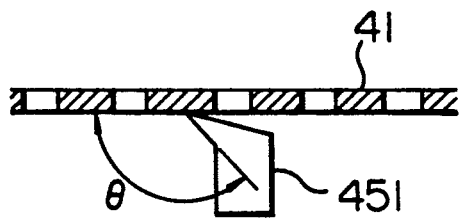
FIG. 21 is a schematic view showing the relationship between a spatula member and mask in the embodiment of FIG. 20.

The spatula member 451 of this embodiment makes a rake angle $\theta$ with respect to the lower surface of the mask 41 as shown in FIG. 21. In the case of this embodiment, the rake angle $\theta$ is set at 120° to 130°, approximately. The rake angle $\theta$ is dependent on the viscosity of ink, so that removal of ink is facilitated by making the rake angle small when the viscosity is high and, contrary to this, by making the rake angle large when the viscosity is low.

Figure 22:
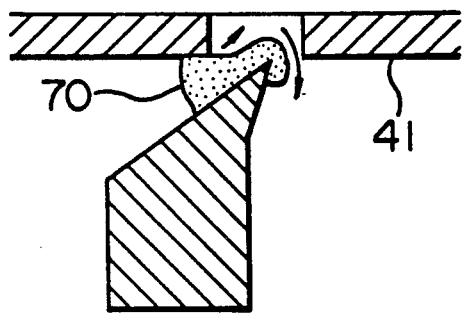
FIG. 22 is a schematic view showing the relatioship between the spatula member and ink in the embodiment of FIG. 20.

As the spatula member 451 with such rake angle is moved to the left as viewed in the drawing, the forward end of the spatula member 451 serves to scrape efficiently the ink dregs 70f from the lower surface of the mask 41. On the other hand, in case that a member shown in FIG. 22 is used as the spatula member, there is a possibility that the ink dregs 70f get between the lower surface of the mask 41 and the member so that the raked ink dregs 70f are pressed into the holes of the mask 41 or go behind the member within the holes of the make 41 to adhere again to the lower surface of the mask 41. The spatula member 451 according to the embodiment of the invention is freed from such disadvantages. Further, since the spatula member 451 is made of a fluoroplastic material, it gives a low tackiness to the ink. For this reason, the scraped ink dregs are not kept adhering to the spatula member 451 but drawn into the suction port 452 due to sucking force of the suction port.

Figure 23:
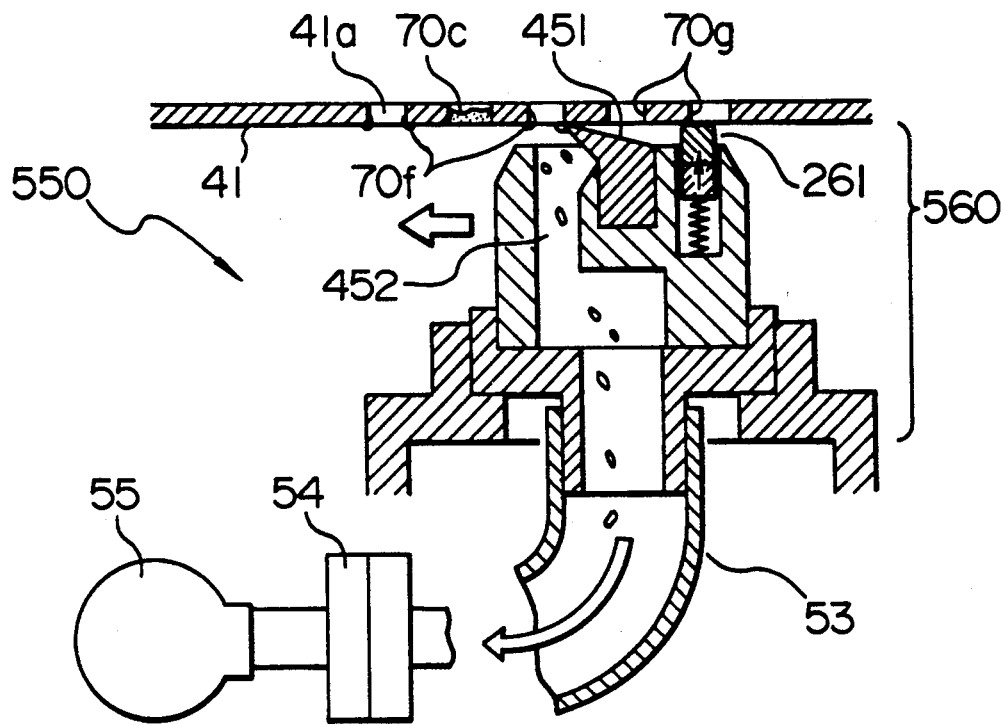
FIG. 23 is a sectional view showing essential portions of a screen printer according to a fifth embodiment of the invention.

FIG. 23 shows essential portions of a cleaning unit 550 of a screen printer according to a fifth embodiment of the invention. A cleaning head 560 of this embodiment is equipped with the same wetted member 261 as that of the second embodiment in addition to the construction of the above-described embodiment. The wetted member 261 imbued with solvent for ink is pushed up by the spring such as to be able to come in contact with the lower surface of the mask 41 at the time of cleaning. However, in this embodiment, the wetted member 261 is disposed in the rear of the spatula member 451, differently from the case of the second embodiment.

In the cleaning operation mode of this embodiment, the ink dregs 70g, which are remaining in the holes 41a of the mask because they could not be removed due to dryness, are softened by being moistened properly by the wetted member 261. In consequence, in the printing operation succeeding to the cleaning operation, the ink dregs 70g can be pushed out from the holes 41a of the mask 41, thereby solving the defective printing.

Furthermore, even in case that the spatula member 451 cannot remove the ink dregs remaining in the flaw or concave in the mask surface, the wetted member 261 can serve to wipe off such ink dregs. As a result, the mask 41 can be cleaned perfectly, thereby making it possible to use continuously the mask over a long time. In addition, it goes without saying that the solvent to be soaked into the wetted member 261 must be the one which doesn't corrode the mask 41.

In the embodiments described above, the suction ports 52, 252 and 452 and related component parts are disposed on the same side as the spatula member with respect to the mask 41. The ink dregs scraped by the spatula member are drawn into the suction port and caught by the ink filter 54. In this case, an airstream attributable to suction serves to make the ink dregs remaining in the holes 41a of the mask 41 come off the side walls of the holes and to make the ink dregs scraped on the spatula member come off the spatula member. For this reason, it is more suitable for the suction to be performed with a large air flow rather than at a large vacuum pressure. Taking notice of the function to make the ink dregs come off the side walls of the holes 41a, the structure may be modified such that an air nozzle or nozzles are disposed on the opposite side to the spatula member with respect to the mask 41.

Figure 24:
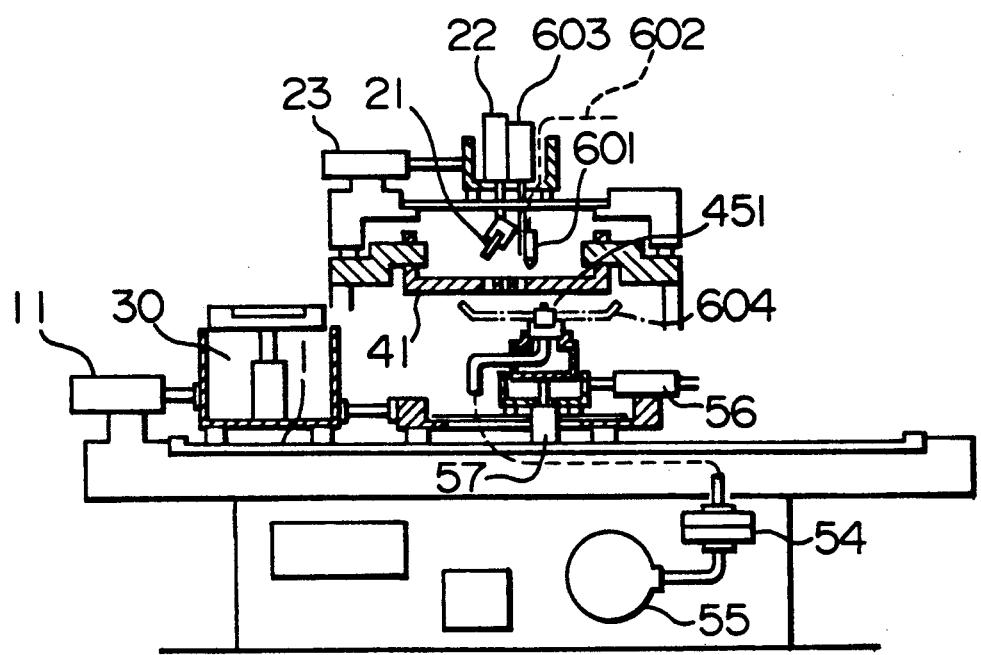
FIG. 24 is a sectional side view of a screen printer according to a sixth embodiment of the invention.

FIG. 24 shows a screen printer according to a sixth embodiment of the invention, which printer has the construction just described above. In this printer, an air nozzle 601 is disposed on the opposite side to the spatula member 451 with respect to the mask 41. The air nozzle 601 is connected with a hose 602 indicated by dotted lines in the drawing so that, in mask cleaning, pressurized air is to be supplied from an accumulator, which is not shown, to the air nozzle through an electromagnetic valve. The air nozzle 601 is supported by a cylinder 603 so as to be hung above the mask 41 so that it can be moved up and down by the action of the cylinder 603 and can be moved right and left as viewed in the drawing by the action of the cylinder 23.

Operation of the cylinders 22, 603 is controlled in such a manner that the air nozzle 601 is retracted upwards when the squeegee 21 is lowered for performing the printing, while the squeegee 21 is retracted upwards and, at the same time, the air nozzle 601 is lowered at the time of cleaning the mask 41, thereby preventing the nozzle and squeegee from interferring with each other. Similarly to the suction ports of the aforesaid embodiments, the air nozzle 601 is operated right and left by the cylinder 23 synchronously with the movement of the spatula member 451 so as to constantly go ahead of the spatula member 451 in the direction of horizontal movement during the cleaning operation.

Further, in order to catch the scraped ink dregs, it is of course possible to provide the suction port 52 and its relates parts like the aforementioned embodiments, and however, in this embodiment, an ink dreg receiver 604 is provided in place of them, thereby promoting the simplification of the construction. The ink dreg receiver 604 surrounds the spatula member 51 as indicated by one-dot chain lines in the drawing.

Use of the air nozzle 601 causes a strong airstream to generate in each hole 41a of the mask 41 so that it is possible to make the ink dregs quickly come off the side wall of the hole 41a.

The present invention has been described above in conjunction with the embodiments, and however, the invention is not limited solely to these specific forms but can be modified in various forms or can be embodied in other forms without exceeding the spirit and scope of the appended claims.

What is claimed is:

1. A screen printer comprising:
   a mask having at least a hole of a printing pattern;
   squeegee means, movable in contact with a first surface of said mask, for printing a pattern of ink on a substrate by causing ink to be squeezed through said hole of said mask;
   spatula means, movable in contact with a second surface of said mask, opposite said first surface, for removing ink adhered to said second surface of said mask; and
   means, movable with said spatula means, for generating an airstream passing through said hole of said mask to remove ink within said hole;
   said airstream generating means comprising air suction means disposed on the same side as said spatula means with respect to said mask; and
   said air suction means includes a suction port disposed forward of said spatula means in a direction of movement thereof, said suction port being formed integrally with said spatula means to be moved together with said spatula means, said suction port being positioned at a fixed distance from said mask when removing ink from said mask.

2. A printer according to claim 1,
   wherein said spatula means includes a flexible elongated spatula member which is disposed to extend across said second surface of said mask;
   wherein a tip end of said spatula member forms a point which points in a direction of movement of said spatula member, said tip end serving to scrape ink while being in contact with said second surface of said mask.

3. A printer according to claim 2, wherein said tip end of said spatula member makes a fixed rake angle with respect to said second surface of said mask.

4. A printer according to claim 3, wherein said fixed rake angle is in a range of about 120° to 130°.

5. A printer according to claim 1,
   wherein said spatula member includes a flexible elongated spatula member which is disposed to extend across said second surface of said mask;
   wherein said spatula member is made of a material which exhibits the characteristics of small abrasion resistance to said mask, low tackiness to the ink and minimal elastic deformation during movement in contact with said mask.

6. A printer according to claim 1, wherein said airstream generating means is movable horizontally along said second surface of said mask and vertically toward and away from said mask.

7. A screen printer comprising:
   a mask having at least a hole of a printing pattern;
   squeegee means, movable in contact with a first surface of said mask, for printing a pattern of ink on a substrate by causing ink to be squeezed through said hole of said mask;
   spatula means, movable in contact with a second surface of said mask, opposite said first surface, for removing ink adhered to said second surface of said mask; and
   means, movable with said spatula means, for generating an airstream passing through said hole of said mask to remove ink within said hole;

wherein said airstream generating means comprises air spray means which is disposed on an opposite side of said mask with respect to said spatula means.

8. A printer according to claim 7, further comprising means for catching ink removed from said mask.

9. A printer according to claim 7, wherein said air spray means includes at least a spray nozzle which is movable in synchronism with said spatula means to be present forward of said spatula means at all times.

10. A printer according to claim 1, further comprising means for applying solvent to ink adhered to said mask, said solvent applying means being movable with said spatula means.

11. A printer according to claim 10, wherein said solvent applying means is disposed forward of said spatula means in a direction of movement thereof.

12. A printer according to claim 10, wherein said solvent applying means is disposed rearward of said spatula means in a direction of movement thereof.

13. A printer according to claim 10, further comprising means for removing extra solvent on said mask, said means being movable with said spatula means.

14. A printer according to claim 13, wherein said solvent applying means and said extra solvent removing means are formed integrally with said spatula means to be moved with said spatula means.

15. A printer according to claim 13, wherein said extra solvent removing means is disposed rearward of said spatula means in a direction of movement thereof.

16. A printer according to claim 10, wherein said airstream generating means comprises air suction means which includes a suction port disposed forward of said solvent applying means in a direction of movement of said spatula means.

17. A printer according to claim 10, wherein said solvent applying means includes a member retaining solvent for ink and a spring for pressing said member against said mask.

18. A printer according to claim 13, wherein said extra solvent removing means includes a member for absorbing solvent and a spring for pressing said member against said mask.

19. A printer according to claim 18, wherein said member for absorbing solvent is formed as a roller rotatable in contact with said mask.

* * * * *